United States Patent [19]

Jambotkar

[11] 4,155,121

[45] May 15, 1979

[54] REDUNDANT CHARGE-COUPLED DEVICE AND METHOD

[75] Inventor: Chakrapani G. Jambotkar, Hopewell Junction, N.Y.

[73] Assignee: International Business Machines Corporation, Armonk, N.Y.

[21] Appl. No.: 920,934

[22] Filed: Jun. 30, 1978

[51] Int. Cl.² .................. G11C 29/00; G11C 19/28
[52] U.S. Cl. ..................................... 365/200; 365/219
[58] Field of Search .............. 365/183, 200, 219, 104; 307/221 C

[56] References Cited

U.S. PATENT DOCUMENTS

| 3,320,618 | 5/1967 | Kuch et al. ............................. 346/35 |
| 3,562,727 | 2/1971 | Abbott et al. ................. 235/61.11 D |
| 3,585,607 | 6/1971 | DeHaan et al. ....................... 365/200 |
| 3,619,568 | 11/1971 | Teplin .......................... 235/61.12 M |
| 3,715,570 | 2/1973 | Weichselbaum et al. ............... 360/1 |
| 3,831,006 | 8/1974 | Chaffin et al. ................... 235/61.7 R |
| 3,986,179 | 10/1976 | Elmer et al. .......................... 365/200 |
| 4,024,509 | 5/1977 | Elmer .................................... 365/200 |
| 4,051,354 | 9/1977 | Choate ................................. 365/200 |

*Primary Examiner*—Stuart N. Recker
*Attorney, Agent, or Firm*—Martin G. Reiffin

[57] ABSTRACT

A hard-wired redundant fault-correctable serial-parallel-serial charge-coupled device structure and method of making same. The parallel section forms a matrix of charge packet storage sites including at least one extra redundant column. Before fabrication is completed the device is tested. If a column of the parallel section matrix contains a defective storage site or other fault, the serial section storage sites corresponding to the defective column are effectively short-circuited by hard-wiring during the completion of fabrication. The modified device is thereby fault-corrected in that the transferred charge packets will bypass the defective column and be transferred instead along the extra redundant column.

16 Claims, 11 Drawing Figures

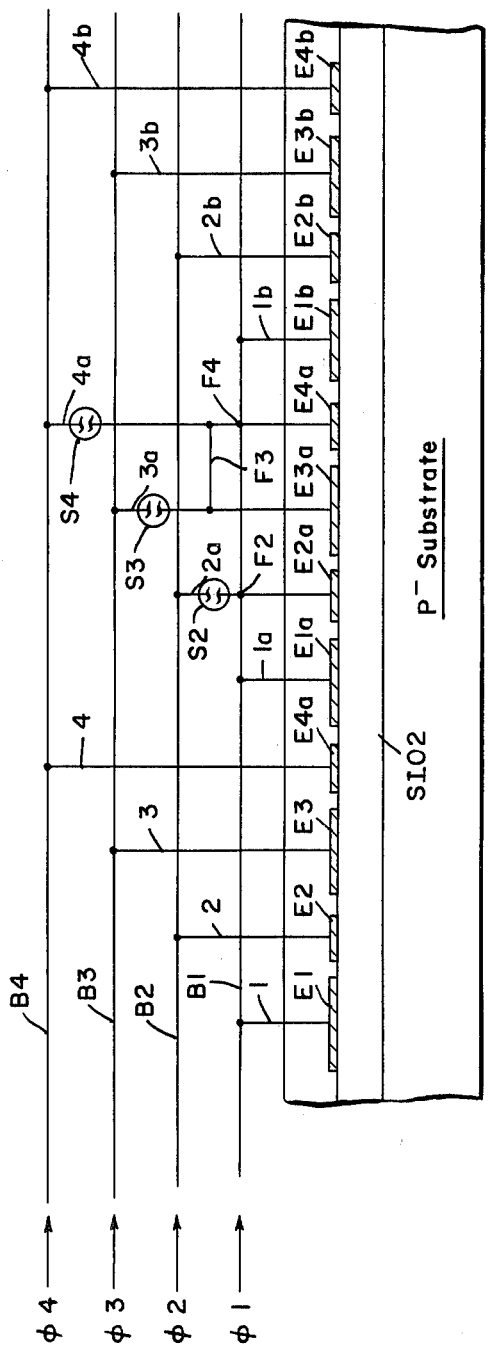
Fig. 3.
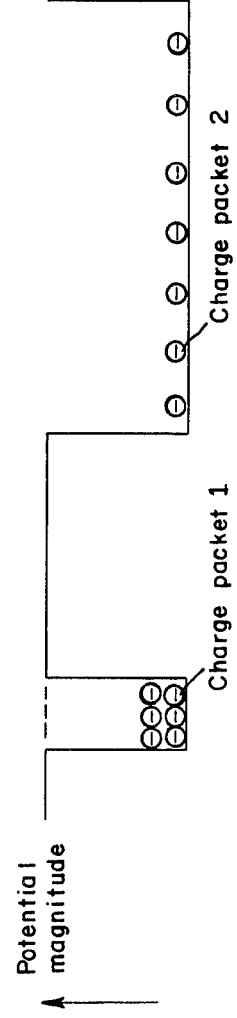
Fig. 4. (Phase 1)
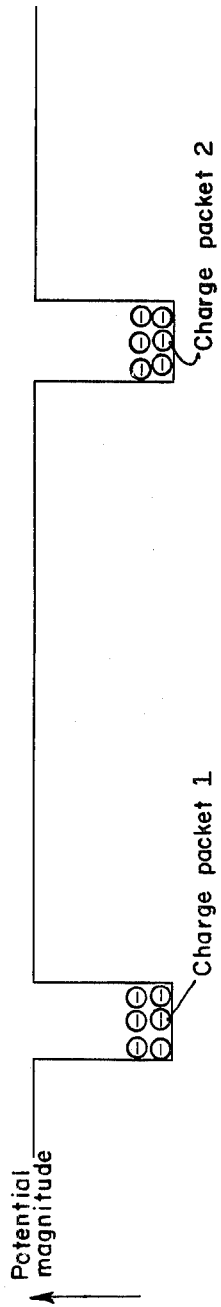
Fig. 5. (Phase 2)

REDUNDANT CHARGE-COUPLED DEVICE AND METHOD

BACKGROUND OF THE INVENTION

1. Field of the Invention

This invention relates generally to serial-parallel-serial charge-coupled devices and more particularly to a redundant fault-correctable device and a method of making same.

2. Description of the Prior Art

Charge-coupled device (CCD) structures for use in data processing system storage and communication signal processing are well known in the art. Referring to the patents and publications listed below under the heading "Reference Cited By Applicant," Boyle and Smith [Refs. 1, 10, 11] originally disclosed the basic charge-coupled concept. Weimer [Ref. 2] disclosed the serial-parallel-serial arrangement. Tompsett [Ref. 3] reviewed further early work, including the serial-parallel-serial configuration. Collins et al. [Ref. 4] disclosed a serial-parallel-serial structure with double-level metallization. Carnes, Kosonocky and Sauer [Refs. 5, 12] disclosed further advances including two-phase operation, buried channel structures, and applications to analog signal processing and image sensors.

In a serial-parallel-serial configuration, a data bit stream is injected into a serial CCD shift register from where it is transferred in parallel to a parallel storage section. The data can then be shifted in parallel through the parallel section, and then transferred in parallel to an output serial register, from where it is shifted out as a serial bit stream.

The parallel section comprises a large matrix of storage sites each adapted to serve as a potential well for storing a packet of charge carriers. Because of the large number of storage sites in the many rows and columns of the matrix, there is a substantial probability that at least one site is defective. As presently practiced in the art, the occurrence of even a single defective site requires that the entire chip be rejected and scrapped.

This approach substantially reduces the manufacturing yield and therefore substantially increases the cost of charge-coupled devices. Because the cost per stored bit is a critical factor in the determination of whether charge-coupled devices are competitive with other storage technologies it is vitally important that the yield of charge-coupled device manufacture be improved by every feasible means.

In efforts to improve the yield of charge-coupled devices and other semiconductor memory chips, numerous "fault tolerant" schemes have been proposed. For example, Elmer et al. [Refs. 9, 13, 14] disclose charge-coupled device memories wherein the address circuitry is modified so as to bypass an entire array of registers or an entire block of arrays. These arrangements are disadvantageous in that the required redundancy is large. That is, a single defective storage site results in the non-utilization of an entire array or block and the necessity for an extra redundant array or block to be provided for the substitution. Furthermore, the address modification structure for bypassing defective arrays or blocks is slow in operation if of the serial addressing type or relatively complex if of the parallel addressing type.

In the prior art of random access memories there have been many schemes for fault tolerance with only moderate redundancy. That is, the presence of a single defective cell requires the substitution of only a redundant row or column of cells, instead of an entire array or block. Choate and Bhandarkar [Ref. 15] refer to many prior art patents disclosing such arrangements. However, these are "address translation" schemes and are pertinent to memories which operate in an addressed random access mode as distinguished from the serial mode of charge-coupled devices. Furthermore, these schemes present all of the disadvantages of cost and complexity involved in the additional logic required for the address translation from the addresses of bad bits to the addresses of good bits.

SUMMARY OF THE INVENTION

It is therefore a primary object of the present invention to provide a novel structure and method of manufacture for improving the yield of charge-coupled devices of the serial-parallel-serial type.

This object is achieved by a fault-correctable configuration having at least one extra redundant column in the matrix of charge storage units constituting the parallel section of the device. Before fabrication of the chip is completed it is tested to determine if the parallel section contains any columns having one or more bad bits; that is, defective charge storage sites or other faults which would render the column unacceptable.

If no such defective columns are determined during the test, manufacture of the chip is completed in the conventional manner. If the test reveals that one or more columns is defective, then fabrication of the chip may be completed in accordance with the novel method of the present invention, provided that the number of defective columns does not exceed the number of extra redundant columns originally designed into the chip.

Assuming that the test reveals that the number of defective columns is not greater than the number of available redundant columns, during the completion of the fabrication process the defective columns are effectively removed from the flow paths of the transferred charge packets and a corresponding number of redundant columns are substituted in these paths instead.

This is achieved by effectively short-circuiting those groups or sets of serial register charge storage sites which correspond to each of the defective columns and which groups would otherwise transmit bit streams of charge packets into the defective columns at the input end of the parallel section and then receive such bit streams therefrom at the output end of the parallel section.

The short-circuiting effect is achieved by connecting all of the gate electrodes of the group to a single clock phase voltage line. For example, in a four-phase arrangement the normal connections of the Phase 2, Phase 3 and Phase 4 gate electrodes to their respective clock phase voltage lines are severed by a laser beam or other means, and these electrodes are instead connected to the Phase 1 clock line by the same technique of a laser beam or other means.

As a result all four charge storage sites, as well as the site corresponding to the Phase 1 electrode of the adjacent group, will be at the same potential so as to form a single enlarged potential well, thereby merging all five storage sites into a single continuous enlarged storage site. Upon subsequent application of the Phase 2 clock signal, the charge packets will be transferred from this enlarged merged site into the site corresponding to the Phase 2 gate of the next set of sites, thereby effectively short-circuiting the first set of sites where the gate electrode connections were modified.

Upon subsequent transfer of the row of charge packets from the serial input section to the first row of the parallel section, the bypassed set of sites of the serial input section will be devoid of any charge packets and hence there will be no transfer of a charge packet into the first site of the defective column, thereby effectively bypassing the latter.

For each extra redundant column provided for the parallel section, the serial input and output sections must be provided with corresponding extra sets of charge storage sites. For example, in a four-phase arrangement, each serial section must have four extra sites for each redundant column in the parallel section.

The foregoing and other objects, features, and advantages of the present invention will be apparent from the following and more particular description of preferred embodiments of the invention, as illustrated in the accompanying drawings.

IN THE DRAWINGS

FIG. 3 is a schematic sectional view of the serial input and output sections and illustrating the circuit topology for short-circuiting a bit set of gate electrodes so as to bypass the corresponding defective column of the parallel section.

FIG. 4 is a potential diagram showing a first charge packet within a potential well at a normal bit set of serial section storage sites, and also a second charge packet within an enlarged potential well extending throughout a shorted set of storage sites, as these potential wells would appear at the Phase 1 clock time.

FIG. 5 is a potential diagram similar to FIG. 4 but showing the two potential wells and their respective charge packets transferred to the respective next adjacent sites at the Phase 2 clock time.

DETAILED DESCRIPTION

Figure 1:
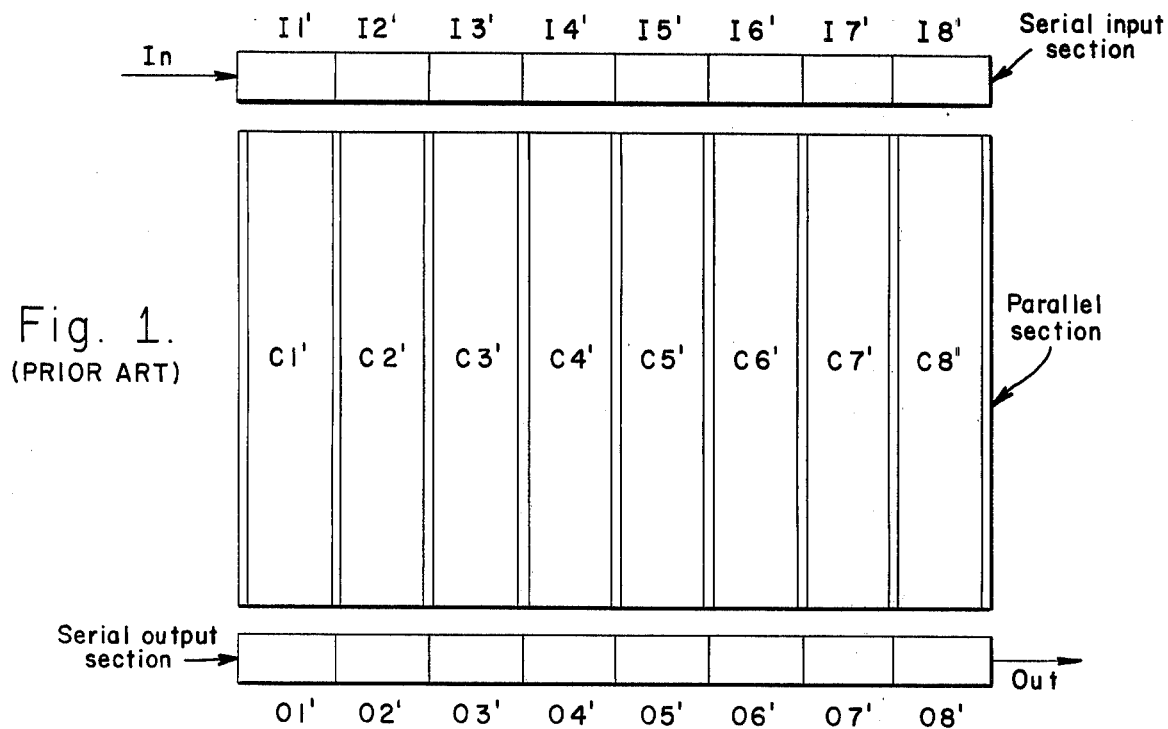
FIG. 1 is a schematic view of a serial-parallel-serial charge-coupled device configuration in accordance with the prior art.

Referring first to FIG. 1, there is shown a serial-parallel-serial charge-coupled configuration in accordance with the prior art. A serial input section is provided with eight bit sets of storage sites, each set being designated by a respective one of the references I1' to I8' and corresponding to a single data bit. For example, in the four-phase arrangement shown each bit set comprises four charge packet storage sites. Only one of the four storage sites has a charge packet stored therein at any clock phase instant of time. Although only eight sets of storage sites are shown in the drawings for simplicity and clarity in illustration, it will be understood that in a production embodiment of the invention each serial section may have many more than eight sets of sites. At the left end of the serial input section as viewed in the drawing, the arrow designated "In" refers to the input port through which a serial stream of data bits is transmitted to the serial input section.

The parallel section is adjacent the serial input section but is shown in the drawing as spaced therefrom for clarity in illustration. The parallel section comprises eight channels or columns extending vertically in the drawing and each designated by respective one of the references C1' to C8' forming in effect a matrix of rows and columns of storage sites with each column constituting a path for charge carrier packets to flow in sequence from a respective one of the storage sites of the serial input section to a respective one of the storage sites of the serial output section.

The latter is similar in construction to the serial input section except that it is provided with an output port designated by the arrow marked "Out" at the right end of the section as shown in the drawing. The serial output section comprises eight bit sets of storage sites, each set being designated by a respective one of the references O1' to O8'. Each of these sets of storage sites corresponds to a respective one of the columns C1' to C8' of the parallel section.

For simplicity and clarity in illustration, the prior art device disclosed in FIG. 1, as well as the configuration in accordance with the present invention as disclosed in the other figures, is a four-phase non-interlaced arrangement. Therefore, each bit set of storage sites of the serial input and output sections consists of four sites with each site of every set corresponding to a respective one of the four phases, as is well-known in the art.

The operation of the prior art of FIG. 1 is conventional and will be only summarily described. A serial stream of charge packets is shifted in serial fashion until each charge packet is stored within a respective one of the bit sets I1' to I8' of the storage sites of the serial input section. These charge packets are then transferred in parallel to the first row of the parallel section matrix, and this row of charge packets is then transmitted in parallel through the parallel section to the serial output section. During this process, successive rows of charge packets are similarly being transferred through the parallel section from the serial input section to the serial output section. When each row of charge packets reaches the last row of storage sites in the parallel section, the row is then transferred in parallel to the serial output section from where the charge packets are shifted serially from the output port designated "Out."

Since in a production embodiment of a serial-parallel-serial charge-coupled device configuration the parallel section comprises many columns and many rows so as to have a large matrix of charge storage sites, there is a substantial probability that one or more of these storage sites may be defective. In this event, the entire charge-coupled device chip, if constructed in accordance with the prior art, is rendered useless and must be scrapped.

This results in a substantial reduction of the yield during the manufacturing operation, thereby greatly increasing the cost of these prior art devices.

The present invention obviates this problem by a novel configuration which enables defective columns of the parallel section to be bypassed so that devices having defective storage sites may be utilized rather than scrapped, thereby substantially increasing the yield and reducing the cost of manufacture.

Figure 2:
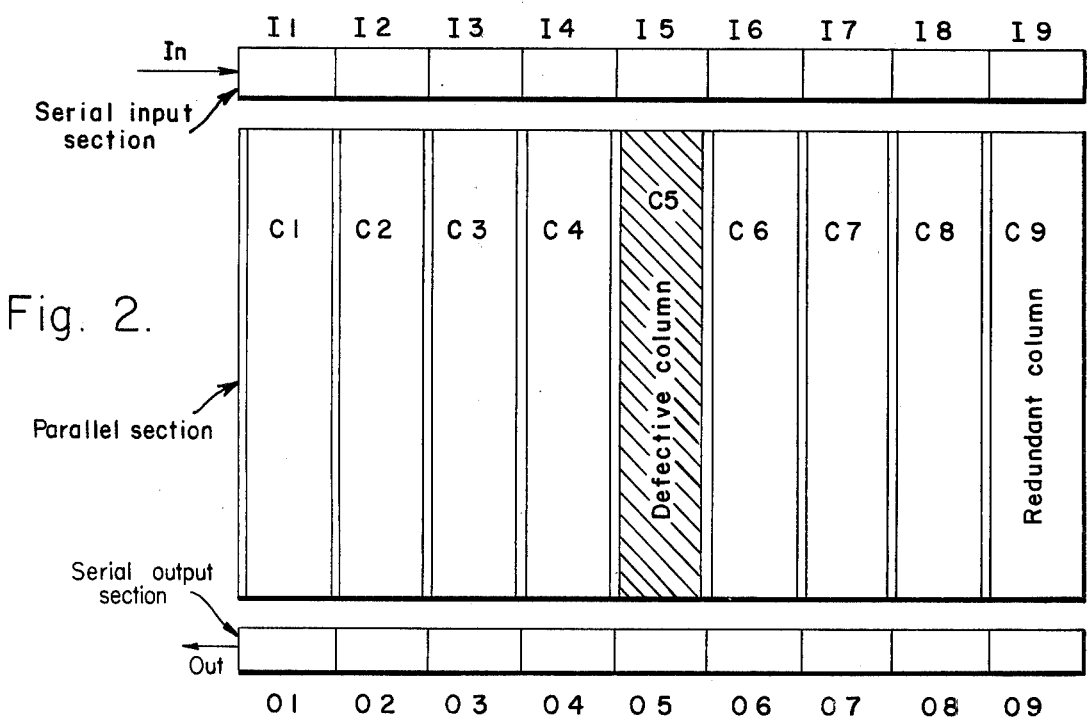
FIG. 2 is a schematic view of a serial-parallel-serial charge-coupled device configuration having an extra redundant parallel section column and extra redundant serial section sites, in accordance with the present invention.

This novel arrangement is shown schematically in FIG. 2 and comprises a serial input section, a parallel intermediate section and a serial output section. The serial input section of FIG. 2 is provided with an extra redundant set of charge storage sites as compared with the prior art arrangement of FIG. 1. That is, the serial input section of FIG. 2 is shown as having nine sets of charge storage sites designated I1 to I9 respectively. Similarly, the parallel section is shown in FIG. 2 as having an extra redundant column as compared with the prior art arrangement of FIG. 1. That is, the parallel section of FIG. 2 is shown as having nine columns or channels designated C1 to C9. Similarly, the serial output section of the invention as shown in FIG. 2 has an extra redundant set of storage sites so as to have nine such sets designated O1 to O9.

The overall operation of the invention will first be summarily described with respect to FIG. 2. The device is manufactured in the conventional manner until just prior to the quartz passivation step. At this point the manufacturing process is interrupted and the device is tested to determine if the parallel section contains any columns having one or more defective storage sites or other faults which would render the column unacceptable. If no such defective columns are determined during the test, manufacture of the chip is completed in the conventional manner. However, if the test reveals that one or more columns is defective, the manufacturing process is modified so as to effectively bypass the defective columns and substitute therefore one or more redundant columns as may be required. This bypassing operation is achieved by effectively short-circuiting each set of serial register charge storage sites which corresponds to each of the defective columns.

For example, in FIG. 2 the parallel section column C5 is designated as defective. Upon determining this defect during the test operation, the corresponding sets of charge storage sites I5 of the serial input section and O5 of the serial output section are short-circuited in a manner to be described below so that the defective column C5 is bypassed. That is, the charge packets that would normally be stored in the storage site set I5 are instead transferred to the next set of sites I6 of the serial input section, so that in effect the site set I6 is substituted for the site set I5, with each of the succeeding sets I7, I8 and I9 storing the charge packets that would normally be stored in site sets I6, I7 and I8 respectively. For example, the first charge packet that would normally be stored in set I8 is instead stored in the extra redundant set I9.

At the instant when the row of charge packets is transferred in parallel to the first row of the parallel section, the site set I5 will be devoid of any charge packets and nothing will be transferred into the defective column C5. The first charge packet in the serial data bit stream will be stored in set I9 at this instant of transfer and hence will flow into the first storage site of the extra redundant column C9 of the parallel section. This first charge packet will then flow through column C9 as each successive row is transmitted toward the serial output section and then will be transferred to the extra redundant set O9 of the serial output section during the parallel transfer of the row of charge packets to the latter.

It will thus be seen that in the event of a defective column of the parallel section, the defective column may be bypassed and an extra redundant column may be utilized so as to render the chip operative. Although for simplicity and clarity in illustration there is shown in FIG. 2 only one extra redundant column and the corresponding extra redundant sets of sites for the serial sections, it will be understood that this redundancy may be pluralized. That is, any desired number of extra redundant columns may be provided along with corresponding extra redundant sets of storage sites in the serial input and output sections. This provides for the fault correction of devices having a plurality of defective columns, provided that the number of extra redundant columns be at least equal to the number of defective columns.

Referring now to FIG. 3, there is shown schematically the circuitry for shorting the bit set of serial section storage sites corresponding to a defective column of the parallel section. The substrate is indicated to be of conductivity type P, although it will be understood that all conductivity types disclosed herein may be reversed. The upper surface of the substrate is provided with an insulating layer SIO2 of silicon dioxide. Superimposed upon the latter are the sets of gate electrodes which form the potential wells which trap the charge carrier packets and thereby provide storage and transfer sites for the charge packets. The first set of gate electrodes is designated E1, E2, E3, E4. The second set of gate electrodes is designated E1a, E2a, E3a, E4a. The third set of gate electrodes is designated E1b, E2b, E3b, E4b.

Gate electrodes E1, E1a, E1b are connected by respective leads 1, 1a, 1b to the bus line B1 to which is applied the $\phi 1$ clock signal at time Phase 1. Similarly, gate electrodes E2, E2a, E2b are normally connected to bus line B2 to which is applied the $\phi 2$ clock signal at time Phase 2; gate electrodes E3, E3a, E3b are normally connected by respective leads 3, 3a, 3b to bus line B3 to which is applied the $\phi 3$ clock pulse signal at Phase 3; the gate electrodes E4, E4a, E4b are normally connected by respective leads 4, 4a, 4b to bus line B4 to which is applied the $\phi 4$ clock pulse signal at time Phase 4.

The intermediate storage sites formed by gate electrodes E1a, E2a, E3a, E4a are assumed, for purpose of illustration, to be associated with a defective column of the parallel section and are therefore shorted in the following manner so as to bypass the defective column. The lead 2a which normally connects gate electrode E2a to the bus B2 is cut or severed as indicated by the symbol at S2. This cut may be made by the conventional laser beam technique during the completion of the fabrication process after the testing step has determined that the column is defective. The portion of lead 2a still connected to gate electrode E2a is then connected at F2 to bus line B1 by conventional laser beam methods. The actual physical locations of the cut S2 and connection F2 are described in detail below with respect to FIG. 7. In a similar manner, lead 3a which normally connects gate electrode E3a to bus line B3 is cut at S3. That portion of lead 3a still connected tpo electrode E3a is connected to lead 4a by a connection symbolized by the line designated F3. Again, the actual physical location of the connection F3 is disclosed below in the detailed description of FIG. 7. The lead 4a normally connecting electrode E4a to bus line B4 is cut at S4. The portion of lead 4a still connected to gate E4a is connected to bus line B1 at F4.

The operation and effect of the short-circuit modification shown in FIG. 3 will now be described with reference to the potential diagrams in FIGS. 4 and 5. Referring first to FIG. 4, this diagram shows the potential magnitude and the resulting potential wells at the time Phase 1. The $\phi 1$ clock signal applied to gate electrode E1 will form a potential well beneath the latter so as to store therein minority charge carriers indicated by the minus symbols within a circle to symbolize electrons and designated by the legend "charge packet 1." Referring now to FIG. 5 which shows the potential magnitudes at the various gates at time Phase 2, it will be seen that the clock signal applied to the second gate electrode E2 forms a potential well thereunder and that the potential magnitude corresponding to the first gate electrode E1 has been lowered so that the potential well formerly beneath the first gate electrode E1 together with charge packet 1 therein has been effectively transferred so as to be adjacent and below the second gate electrode E2. It will be obvious that at time Phase 3 the potential well and the charge packet 1 therein will be transferred to a position immediately below gate electrode E3, and in a similar manner the potential well and charge packet 1 will be transferred to the storage site form by gate electrode E4 at Phase 4. As thus far described, the mode of operation is conventional for a four-phase non-interlaced serial-parallel-serial configuration.

Referring again to FIG. 4, the cuts S2, S3, S4 and connections F2, F3, F4 serve to short-circuit the second bit set of storage sites formed by gate electrodes E1a, E2a, E3a, E4a and thereby bypass the corresponding defective column of the parallel section, in the following manner. At time Phase 1, the $\phi 1$ clock signal normally applied only to the first gate electrode of the set is, by virtue of the cuts and connections shown in FIG. 3 for the intermediate set of storage sites, applied to all four electrodes E1a, E2a, E3a, E4a of the intermediate set. As a result, the regions immediately below these four electrodes form one merged enlarged potential well as shown in FIG. 4. These four merged potential wells will also merge with the potential well formed by gate electrode E1b of the third set of charge storage sites. As shown in FIG. 4, this enlarged merged potential well extending beneath five contiguous gate electrodes is capable of storing a single charge packet designated in FIG. 4 as "charge packet 2."

Referring now to FIG. 5, it will be seen that upon application of the $\phi 2$ clock signal at time Phase 2, charge packet 2 formerly spread throughout the enlarged potential well extending beneath the five gate electrodes E1a, E2a, E3a, E4a, E1b is transferred to the potential well formed beneath the second gate electrode E2b of the third set of storage sites shown in FIG. 3. If the cuts S2, S3, S4 and connections F2, F3, F4 had not been made, charge packet 2 would normally have been located within a potential well corresponding to the second gate electrode E2a of the intermediate set of storage sites. However, by virtue of the novel method and structure of the present invention, charge packet 2 is displaced a distance of one entire bit set of storage sites so that the intermediate set corresponding to electrodes E1a, E2a, E3a, E4a is effectively short-circuited.

That is, during Phase 2, Phase 3 and Phase 4 the short-circuited storage sites corresponding to electrodes E1a, E2a, E3a, E4a are devoid of any charge packets, and hence during the transfer of a row of charge packets in parallel to the first row of the matrix of the parallel section, no charge packet will be transferred into the defective column corresponding to the short-circuited set of storage sites. As a result, the defective column is bypassed and rendered inoperative.

Figure 6:
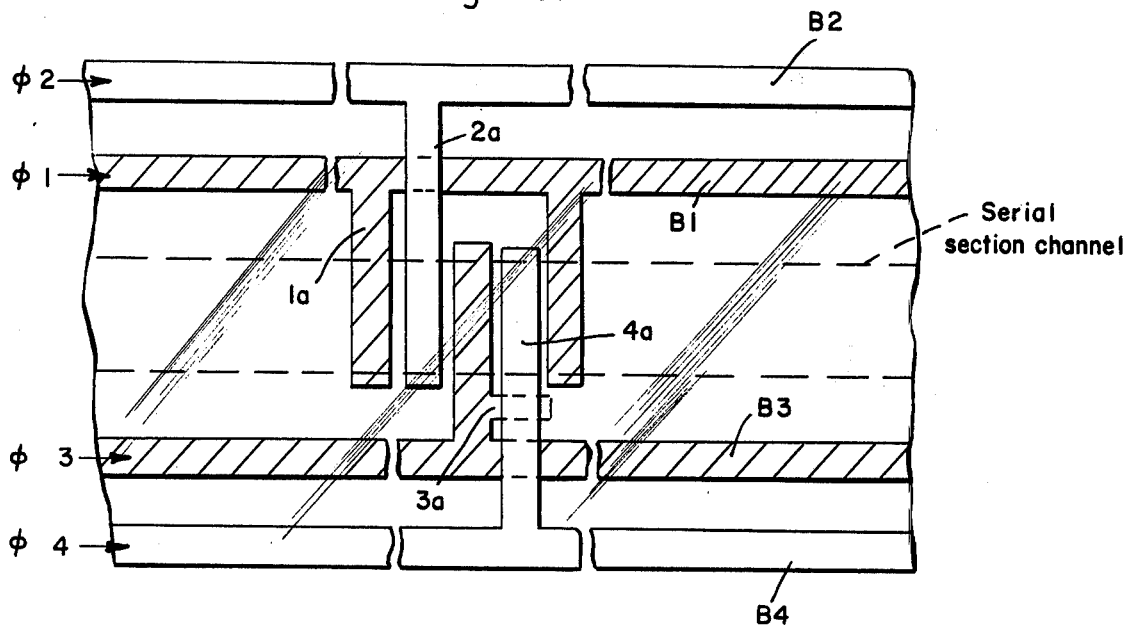
FIG. 6 is a sectional plan view showing a portion of a serial section before the cutting and connecting steps which provide the short-circuiting aspect of the present invention.
Figure 7:
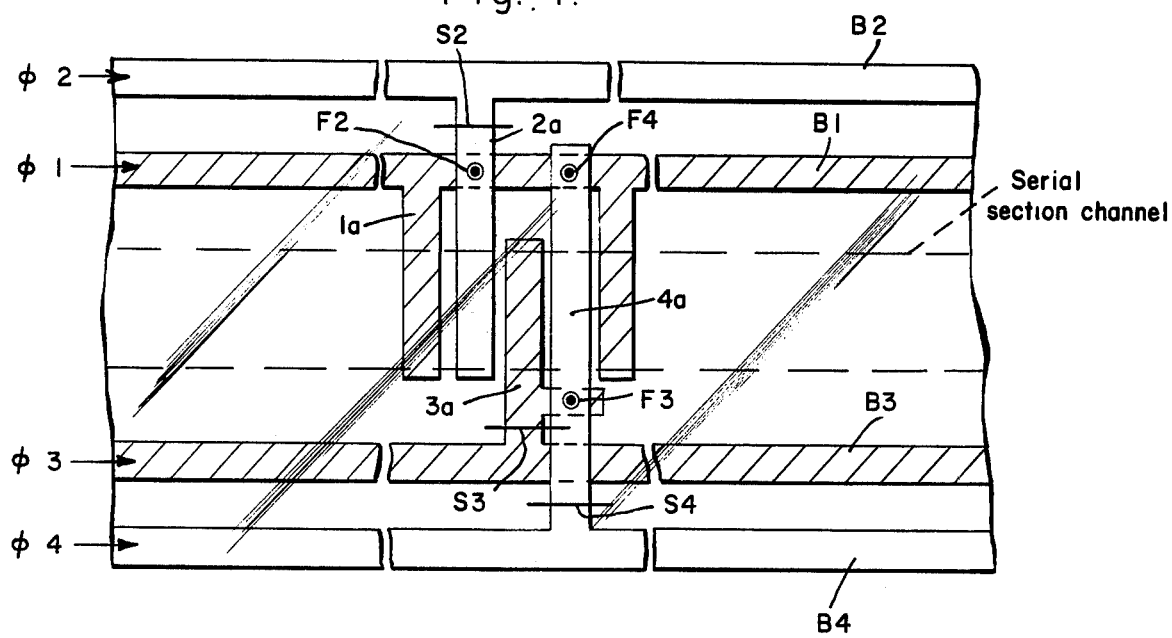
FIG. 7 is a view similar to FIG. 6 but showing the cuts and connections in accordance with the present invention which effectively short-circuit the bit set of serial section storage sites associated with a defective parallel section column so as to bypass the latter.

Referring now to FIGS. 6 and 7, the locations of the cuts S2, S3, S4 and connections F2, F3, F4 will now be described. The bus line B2 extending horizontally at the upper portions of these figures is shown as composed of metal and having a downwardly extending portion corresponding to lead 2a. Extending horizontally below bus line B2 is the bus line B1 shown to be composed of polysilicon. The third horizontally extending bus line B3 is also shown to be composed of polysilicon, and the lowermost bus line B4 is shown to be composed of metal. Bus line B1 is provided with a downwardly extending portion corresponding to lead 1a. Bus line B3 is provided with an upwardly extending portion corresponding to lead 3a, and bus line B4 is provided with an upwardly extending portion corresponding to lead 4a and extending adjacent and parallel to the portion 3a.

As shown in FIG. 7, the laser beam cut S2 severs portion 2a at a point between bus line B2 and bus line B1. Laser beam cut S3 severs portion 3a at a point immediately adjacent to bus line B3. Laser beam cut S4 severs portion 4a at a point immediately adjacent to bus line B4. Connection F2 is formed by a laser beam which fuses a conductive path between portion 2a and bus line B1. The laser beam also forms connection F3 by fusing a conductive path between portion 4a and a laterally extending region of portion 3a. The laser beam also forms connection F4 by fusing a conductive path between the upper end of portion 4a and the bus line B1.

Figure 8:
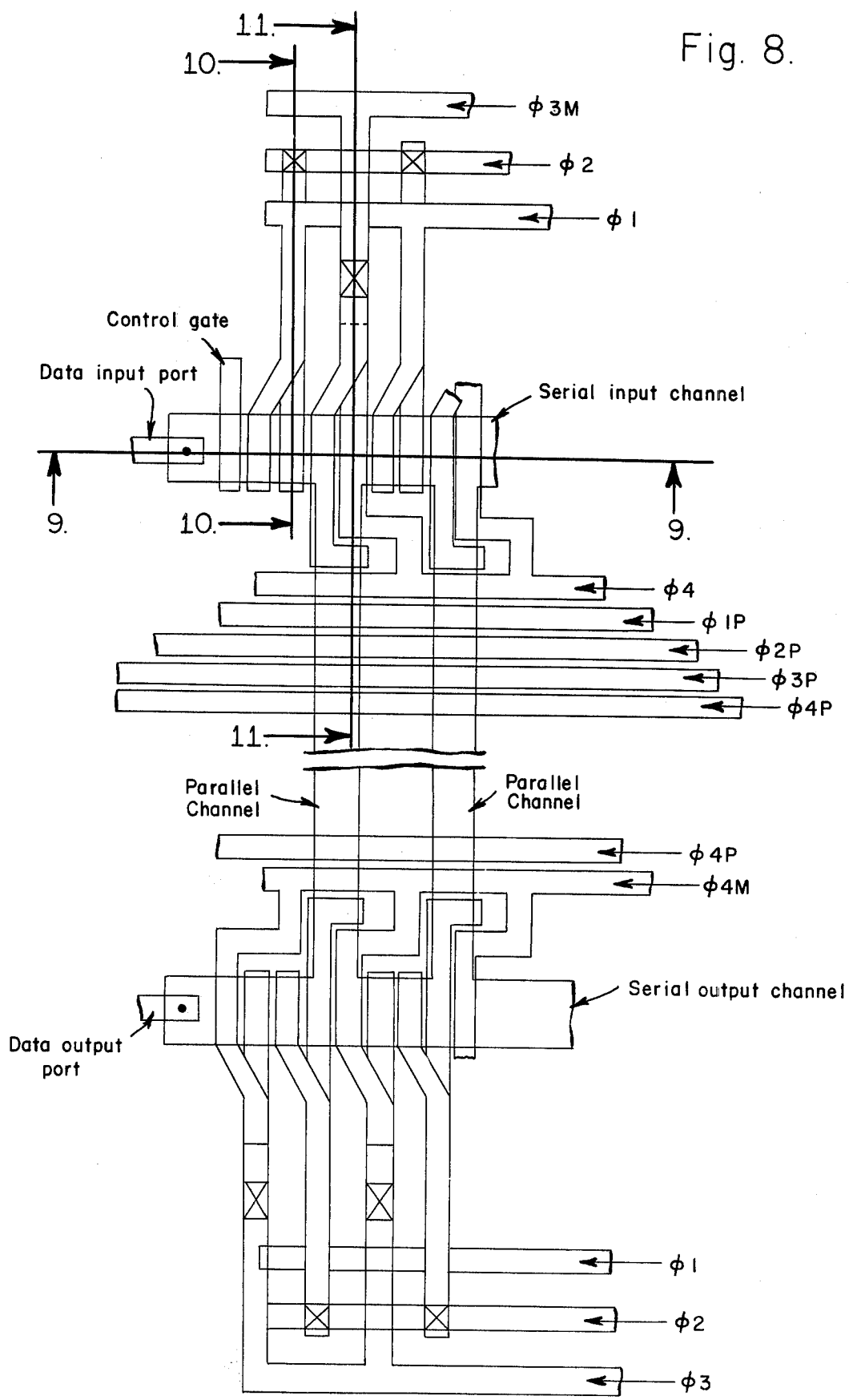
FIG. 8 is a schematic plan view showing the geometry of the metal and polysilicon lines associated with two serial sections and an intermediate parallel section.
Figure 9:
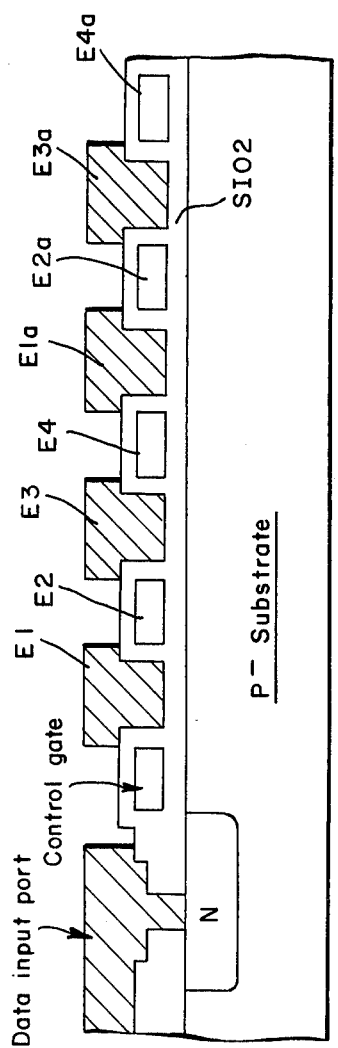
FIG. 9 is a vertical sectional view taken substantially on Line—9 of FIG. 8.

Referring now to FIG. 9 in conjunction with FIG. 8, there is shown the physical structure of the serial input section which is conventional and well-known in the art. At the left end of FIG. 9 as viewed in the drawing there is indicated generally the data input port comprising a metal connection extending downwardly through the silicon dioxide layer SIO2 into contact with an N-type diffusion region. Adjacent the latter is a control gate preferably formed of polysilicon and buried within the silicon dioxide layer SIO2. The first gate electrode E1 is shown to be composed of metal, and the second gate electrode E2 is shown to be composed of polysilicon. Similarly, the successive odd-numbered gate electrodes E3, E1a, E3a, are formed of metal and the successive alternating even-numbered gate electrodes E4, E2a, E4a are polysilicon and embedded within the silicon dioxide layer SIO2.

Figure 10:
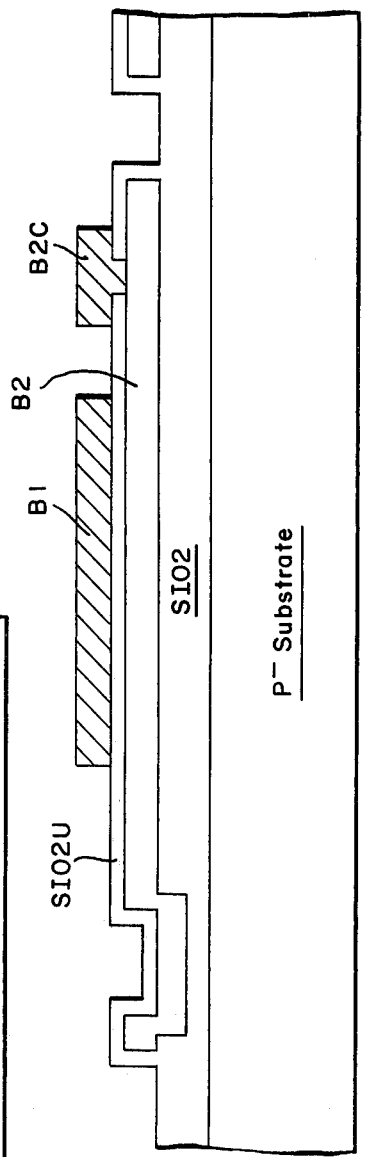
FIG. 10 is a vertical sectional view taken substantially on Line 10—10 of FIG. 8.

Referring now to FIG. 10 in conjunction with FIG. 8, the former view shows the substrate having at its upper surface a silicon dioxide insulating layer SIO2. The latter has an uppermost portion SIO2U extending over the polysilicon bus line B2 which is thus buried within the silicon dioxide layer. A metal contact B2C extends downwardly through the upper silicon dioxide layer portion SIO2U so as to make contact with the polysilicon bus line B2. The metal bus line B1 is superimposed over the upper surface of silicon dioxide layer portion SIO2U.

Figure 11:
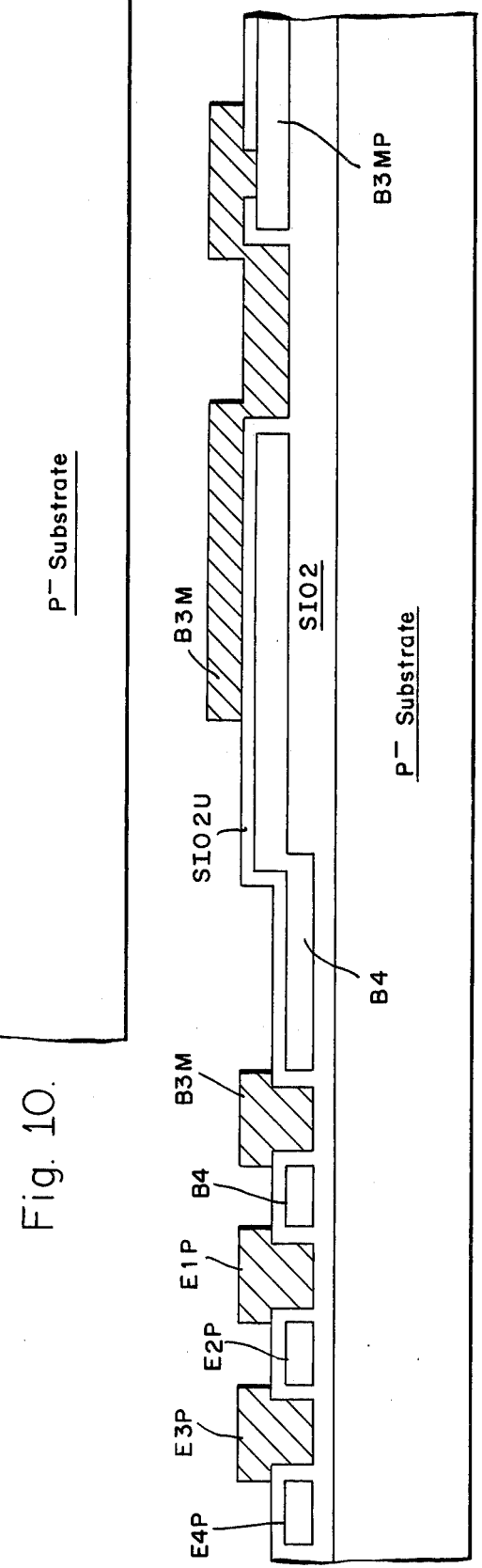
FIG. 11 is a vertical sectional view taken substantially on Line 11—11 of FIG. 8.

Referring now to FIG. 11 in conjunction with FIG. 8, the former view shows a set of four gate electrodes E1P, E2P, E3P, E4P forming four successive contiguous charge packet storage sites in one of the columns or channels of the parallel sections. The even-numbered parallel gate electrodes, such as indicated at E2P and E4P, are composed of polysilicon buried within the insulating silicon dioxide layer SIO2, and the odd-numbered gate electrodes of the parallel section, such as indicated at E1P and E3P, are formed of metal. The polysilicon bus line B4 is shown in FIG. 10 as embedded within the insulating silicon dioxide layer SIO2 below the upper portion SIO2U thereof. The reference designations B3M and B3MP designate metal and polysilicon bus lines, respectively, for the $\phi$3M clock signals described below.

Referring again to FIG. 8, the four clock signals $\phi$1, $\phi$2, $\phi$3, $\phi$4 for the serial input and output sections are applied to the respective bus lines indicated. The bus lines of the parallel section have applied thereto the respective clock signals $\phi$1P, $\phi$2P, $\phi$3P, $\phi$4P where indicated. The serial input channel with its data input port and control gate are shown in the upper portion of FIG. 8. The serial output channel with its data output port are shown in the lower portion of FIG. 8. The middle portion of FIG. 8 shows the location of the parallel channels constituting the matrix of charge storage sites of the parallel section.

It will be noted in FIG. 8 that two of the clock signals are designated $\phi$3M and $\phi$4M. The $\phi$3M clock signal is a modified version of the $\phi$3 signal and is identical to the latter except that the $\phi$3M signal also "comes up" simultaneously with the $\phi$4 signal at the instant when a row of charge packets is transferred in parallel from the serial input section to the first row of the matrix of the parallel section. Similarly, the $\phi$4M clock signal is a modification of the $\phi$4 clock signal and is identical therewith except that the $\phi$4M signal also "comes up" along with the $\phi$1 signal at the instant when a row of charge packets is transferred from the last row of the parallel section into the serial output section. These clock signals and the transfer operations effected thereby are conventional and well-known in the art.

While the disclosed embodiment described above is a non-interlaced arrangement for simplicity and clarity in illustration, the present invention may be readily embodied in an interlaced arrangement. In the latter, there is usually two columns in the parallel section corresponding to one bit length of the serial sections. By contrast, in the non-interlaced organization, there is only one parallel section column corresponding to one bit length of the serial sections. In the interlaced organization, a train of charge packets representing "1" (or the absence of charge packets representing "0" bits) is first transferred to the first bit location in every other parallel section column (say, the "odd" columns), and temporarily held there. Then another train of charge packets (or no charge packets) is transferred to the first bit location in the "even" parallel section columns. Then the row of charge packets is moved along all parallel columns from row to row of the parallel section matrix.

The manner of embodying the present invention in an interlaced configuration is as follows. For each redundant parallel section column discussed above, it is now necessary to consider a pair of parallel section columns; i.e., a pair of extra redundant columns is provided as a potential substitute for each defective pair of columns. If any one of the parallel section columns forming a "pair" is found to be defective as a result of testing the incomplete device, then both columns of the pair may be bypassed and a redundant pair of columns substituted for the defective pair. This will occur if the above-described laser beam cuts and connections are implemented in an interlaced configuration.

While the invention has been shown and particularly described with reference to a preferred embodiment, it will be understood by those skilled in the art that various changes in form and detail may be made therein without departing from the scope of the invention which is delineated by the appended claims.

References Cited By Applicant

1. Boyle, W. S. and Smith, G. E., "Charge Coupled Semiconductor Devices," Bell Sys. Tech. J. (April 1970) pp. 587–593.
2. Weimer, P. K., U.S. Pat. No. 3,763,480; issued Oct. 2, 1973; filed Oct. 12, 1971.
3. Tompsett, M. F., "Charge Transfer Devices," J. Vac. Sci. Technol., Vol. 9, No. 4, (July–August 1972) pp. 1166–1181.
4. Collins, D. R., Barton, J. B., Buss, D. C., Kmetz, A. R., and Schroeder, J. E., "CCD Memory Options," 1973 IEEE International Solid-State Circuits Conference, (February 1973) pp. 136–137, 210.
5. Carnes, J. E. and Kosonocky, W. F., "Charge-Coupled Devices and Applications," Solid State Technology, (April 1974) pp. 67–77.
6. Altman, L., "New MOS Technique Points Way to Junctionless Devices," Electronics (May 1970) pp. 112–118.
7. Altman, L., "The New Concept for Memory and Imaging: Charging Coupling," Electronics (June 1971) pp. 50–59.
8. Altman, L., "Charge-coupled Devices Move in on Memories and Analog Signal Processing," Electronics (August 1974) pp. 91–101.
9. Elmer, B. R., Tchon, W. E., Denboer, A. J., Frommer, R., Kohyama, S. and Hirabayashi, K. "Fault Tolerant 92160 Bit Multiphase CCD Memory," IEEE International Solid-State Circuits Conference (February 1977) pp. 116–117.
10. Boyle, W. S. and Smith, G. E., U.S. Pat. No. 3,858,232; issued Dec. 31, 1974; filed Nov. 9, 1971.
11. Smith, G. E., U.S. Pat. No. 3,761,744; issued Sept. 25, 1973; filed Dec. 2, 1971.
12. Kosonocky, W. F. and Sauer, D. J., U.S. Pat. No. 3,967,254; issued June 29, 1976; filed Nov. 18, 1974.
13. Elmer, B. R., U.S. Pat. No. 4,024,509; issued May 17, 1977; filed June 30, 1975.
14. Elmer, B. R. and Tchon, W. E., U.S. Pat. No. 3,986,179; issued Oct. 12, 1976; filed June 30, 1975.
15. Choate, W. C. and Bhandarkar, D. P., U.S. Pat. No. 4,047,163; issued Sept. 6, 1977; filed July 3, 1975.

I claim:

1. In a hard-wired redundant fault-correctable serial-parallel-serial charge-coupled device structure for storing bits in an N×M matrix and comprising
a serial input section formed in a semiconductor material and including a predetermined number of charge storage sites arranged in a serial path and each site having associated therewith a respective gate electrode controlling the electrical potential of the site,
a serial output section formed in said semiconductor material and including a number of charge storage sites equal to said predetermined number and arranged in a serial path and each site having associated therewith a respective gate electrode for controlling the electrical potential of the site, a parallel intermediate section formed in said semiconductor material and including a matrix of charge storage sites arranged in (N−2) rows and M columns forming M parallel paths extending from said serial input section to said serial output section, each of said parallel paths extending from a respective associated input section storage site to a respective associated output section storage site, each of said parallel section rows of charge storage sites having associated therewith at least one gate electrode means extending adjacent all of the sites of the respective row to control the potentials of the sites of that row, input means for feeding a serial stream of charge packets to one end of said serial input section, control clocking means for applying voltages to the electrodes of the serial input section to transfer said charge packets serially from site to site until the input section contains a row of charge packets, said control clocking means including means for applying voltages to the electrodes of the parallel intermediate section to transfer successive rows of charge packets from the serial input section to the serial output section, output means for transmitting a serial stream of quantized signals, said control clocking means including means for applying voltages to the electrodes of the serial output section to transfer each row of charge packets therein serially from site to site to said output means, the improvement wherein:

said parallel section comprises at least one extra redundant column of storage sites in addition to said M columns, each of said serial sections comprising at least one extra redundant storage site associated with said parallel section redundant column, and means for short-circuiting the respective serial section storage sites associated with at least one defective parallel section column thereby bypassing the latter and permitting rows of M charge packets to be transmitted only along the paths of a number M of the non-defective columns of the parallel section.

2. A charge-coupled device structure as recited in claim 1 wherein said electrodes of each serial section are arranged in at least M+1 sets with the electrodes of each set being located in serial mutually contiguous relation, said electrode voltages applied by the control clocking means being generated at a plurality of time sequenced phases, each of said electrode sets having a number of electrodes equal to the number of said phases, the voltage generated at each of said time phases being applied to a respective one of the electrodes of each set except for any short-circuited sets, said short-circuiting means comprising means for conductively shorting together all of the electrodes of a set so as to apply to said set of electrodes only that voltage generated at one of said plurality of phases, whereby the contiguous charge storage sites adjacent the conductively shorted electrodes are merged to form a single enlarged charge storage site.

3. A charge-coupled device as recited in claim 1 wherein said electrode voltages are sequentially timed at a plurality of time phases, the gate electrodes being arranged in sets with one gate electrode of each non-short-circuited set having applied thereto a voltage corresponding to a respective one of said time phases, said short-circuiting means including means for applying a single time phase voltage simultaneously to all the gate electrodes of a set.

4. A method of manufacturing a hard-wired redundant fault-correctable serial-parallel-serial charge-coupled device structure for storing bits in an N×M matrix and comprising forming in a semiconductor material a serial input section including a predetermined number of charge storage sites arranged in a serial path and each site having associated therewith a respective gate electrode controlling the electrical potential of the site, forming in said semiconductor material a serial output section including a number of charge storage sites equal to said predetermined number and arranged in a serial path and each site having associated therewith a respective gate electrode for controlling the electrical potential of the site, forming in said semiconductor material a parallel intermediate section including a matrix of charge storage sites arranged in (N−2) rows and at least M+1 columns constituting at least M+1 parallel paths extending from said serial input section to said serial output section, testing the parallel section to identify a defective column thereof, and short-circuiting the respective serial section storage sites associated with a defective parallel section column.

5. A method of manufacturing a charge-coupled device structure as recited in claim 4 and comprising forming said electrodes of each serial section in at least M+1 sets with the electrodes of each set being located in serial mutually contiguous relation, said short-circuiting step comprising the step of conductively shorting together all of the electrodes of a set.

6. A method of manufacturing a charge-coupled device as recited in claim 5 and comprising the steps of forming in said device a plurality of clocking signal voltage lines, connecting each of said voltage lines to a respective electrode of each of said sets, said short-circuiting step comprising the steps of:

severing the connections of all but one of the voltage lines to the respective electrodes of the set to be short-circuited, and connecting said last-recited electrodes to said one voltage line.

7. A method of manufacturing a charge-coupled device as recited in claim 6 wherein said severing step comprises directing a laser beam at the connections to be severed.

8. A method of manufacturing a charge-coupled device as recited in claim 6 wherein said connecting step comprises directing a laser beam to fuse regions forming conductive paths extending from said last-recited electrodes to said one voltage line.

9. In a hard-wired redundant fault-correctable serial-parallel-serial charge-coupled device structure comprising
a serial input section formed in a semiconductor material and including a predetermined number of charge storage sites arranged in a serial path,
a serial output section formed in said semiconductor material and including a number of charge storage sites equal to said predetermined number and arranged in a serial path,
a parallel intermediate section formed in said semiconductor material and including a matrix of charge storage sites arranged in rows and columns forming parallel paths extending from said serial input section to said serial output section,
each of said parallel paths extending from a respective associated input section storage site to a respective associated output section storage site,
input means for feeding a serial stream of charge packets to one end of said serial input section,
control clocking means to transfer said charge packets serially from site to site until the input section contains a row of charge packets,
said control clocking means including means to transfer successive rows of charge packets from the serial input section to the serial output section,
output means for transmitting a serial stream of quantized signals,
said control clocking means including means to transfer each row of charge packets therein serially from site to site to said output means,
the improvement wherein:
said parallel section comprises at least one extra redundant column of storage sites,
each of said serial sections comprising at least one extra redundant storage site associated with said parallel section redundant column,
and means for short-circuiting the respective serial section storage sites associated with at least one defective parallel section column thereby bypassing the latter.

10. A charge-coupled device structure as recited in claim 9 wherein
each of said serial section sites has associated therewith a gate electrode, said short-circuiting means comprising means for conductively shorting together all of the electrodes of a plurality of electrodes,
whereby the contiguous charge storage sites adjacent the conductively shorted electrodes are merged to form a single enlarged charge storage site.

11. A charge-coupled device as recited in claim 9 wherein
said electrodes have applied thereto voltages sequentially timed at a plurality of time phases,
the gate electrodes being arranged in sets with one gate electrode of each non-short-circuited set having applied thereto a voltage corresponding to a respective one of said time phases,
said short-circuiting means including means for applying a single time phase voltage simultaneously to all the gate electrodes of a set.

12. A method of manufacturing a hard-wired redundant fault-correctable serial-parallel-serial charge-coupled device and comprising
forming in a semiconductor material a serial input section including a predetermined number of charge storage sites arranged in a serial path,
forming in said semiconductor material a serial output section including a number of charge storage sites equal to said predetermined number and arranged in a serial path,
forming in said semiconductor material a parallel intermediate section including a matrix of charge storage sites arranged in rows and columns constituting parallel paths extending from said serial input section to said serial output section,
testing the parallel section to identify a defective column thereof,
and short-circuiting the respective serial section storage sites associated with a defective parallel section column.

13. A method of manufacturing a charge-coupled device structure as recited in claim 12 and comprising
forming said electrodes in each serial section and each electrode being adjacent a respective site,
said short-circuiting step comprising the step of conductively shorting together all of the electrodes of a plurality of contiguous electrodes.

14. A method of manufacturing a charge-coupled device as recited in claim 13 and comprising the steps of
forming in said device a plurality of clocking signal voltage lines,
connecting each of said voltage lines to a respective group of said electrodes,
said short-circuiting step comprising the steps of:
severing the connections of all but one of the voltage lines to the respective electrodes of a set to be short-circuited, and
connecting said last-recited electrodes to said one voltage line.

15. A method of manufacturing a charge-coupled device as recited in claim 14 wherein
said severing step comprises directing a laser beam at the connections to be severed.

16. A method of manufacturing a charge-coupled device as recited in claim 14 wherein
said connecting step comprises directing a laser beam to fuse regions forming conductive paths extending from said last-recited electrodes to said one voltage line.

* * * * *